(12) United States Patent
Wei et al.

(10) Patent No.: US 11,916,127 B2
(45) Date of Patent: Feb. 27, 2024

(54) MULTI-LAYER ELECTRODE TO IMPROVE PERFORMANCE OF FERROELECTRIC MEMORY DEVICE

(71) Applicant: Taiwan Semiconductor Manufacturing Company, Ltd., Hsinchu (TW)

(72) Inventors: Yi Yang Wei, Hsinchu (TW); Bi-Shen Lee, Hsinchu (TW); Hsin-Yu Lai, Hsinchu (TW); Hai-Dang Trinh, Hsinchu (TW); Hsing-Lien Lin, Hsin-Chu (TW); Hsun-Chung Kuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 73 days.

(21) Appl. No.: 17/349,273

(22) Filed: Jun. 16, 2021

(65) Prior Publication Data

US 2022/0406916 A1    Dec. 22, 2022

(51) Int. Cl.
| | |
|---|---|
| H01L 29/51 | (2006.01) |
| H01L 21/28 | (2006.01) |
| H01L 49/02 | (2006.01) |
| H10B 51/30 | (2023.01) |
| H10B 53/00 | (2023.01) |

(52) U.S. Cl.
CPC ............ *H01L 29/516* (2013.01); *H01L 28/57* (2013.01); *H01L 28/65* (2013.01); *H01L 28/75* (2013.01); *H01L 29/40111* (2019.08); *H10B 51/30* (2023.02); *H10B 53/00* (2023.02)

(58) Field of Classification Search
CPC ......... H01L 28/57; H01L 28/65; H01L 28/75; H01L 29/40111; H01L 29/516; H10B 51/30; H10B 53/00
See application file for complete search history.

(56) References Cited

U.S. PATENT DOCUMENTS

| | | | | |
|---|---|---|---|---|
| 6,303,952 B1 * | 10/2001 | Aoki | ....................... | H01L 28/75 257/E21.59 |
| 6,376,325 B1 * | 4/2002 | Koo | ......................... | H01L 28/75 438/258 |
| 2002/0180045 A1 | 12/2002 | Zhang et al. | | |
| 2007/0045689 A1 * | 3/2007 | Lim | ......................... | H01L 28/55 257/295 |
| 2013/0155572 A1 * | 6/2013 | Popovici | .................. | H01L 28/57 427/532 |
| 2022/0002622 A1 | 1/2022 | Takahashi et al. | | |

FOREIGN PATENT DOCUMENTS

| | | | | | |
|---|---|---|---|---|---|
| CN | 101409303 A | | 4/2009 | | |
| JP | 2000216350 A | * | 8/2000 | ............. | H01L 28/75 |
| WO | WO-02056383 A1 | * | 7/2002 | ....... | H01L 27/10894 |

* cited by examiner

*Primary Examiner* — Matthew E Warren
(74) *Attorney, Agent, or Firm* — Eschweiler & Potashnik, LLC (57) ABSTRACT

Various embodiments of the present disclosure are directed towards a memory device including a first bottom electrode layer over a substrate. A ferroelectric switching layer is disposed over the first bottom electrode layer. A first top electrode layer is disposed over the ferroelectric switching layer. A second bottom electrode layer is disposed between the first bottom electrode layer and the ferroelectric switching layer. The second bottom electrode layer is less susceptible to oxidation than the first bottom electrode layer.

20 Claims, 9 Drawing Sheets

Fig. 14

US 11,916,127 B2

MULTI-LAYER ELECTRODE TO IMPROVE PERFORMANCE OF FERROELECTRIC MEMORY DEVICE

BACKGROUND

Many modern-day electronic devices contain electronic memory configured to store data. Electronic memory may be volatile memory or non-volatile memory. Volatile memory stores data while it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric random-access memory (FeRAM) device has a bottom electrode that is separated from a top electrode by a ferroelectric switching layer comprising a ferroelectric material (e.g., hafnium oxide). The ferroelectric material has an intrinsic electric dipole that can be switched between a first polarization state and a second polarization state. During operation of the FeRAM device, a program voltage or an erase voltage is applied between the top and bottom electrodes to switch the ferroelectric switching layer to the first polarization state or to the second polarization state, respectively. The first and second polarization states provide the FeRAM device with different capacitances, which can be sensed during a read operation by a read voltage on a bit-line. The different capacitances are representative of different data states (e.g., a logical "0" or "1"), thereby allowing the FeRAM device to digitally store data. Further, the FeRAM device may be integrated in a back-end-of-line (BEOL) structure between conductive wires that comprise a diffusive species (e.g., copper). The top and bottom electrodes may respectively comprise a diffusion barrier material (e.g., tantalum nitride, titanium nitride, or the like) that is configured to prevent diffusion of the diffusive species (e.g., copper) to the ferroelectric switching layer.

After fabrication of the FeRAM device, a baking process may be performed on the FeRAM device to verify data retention of the FeRAM device at high temperatures (e.g., temperatures greater than or equal to 85 degrees Celsius). However, the baking process may result in problems, such as oxygen atoms migrating from the ferroelectric material to react with the top and bottom electrodes. The reaction may result in formation of oxides (e.g., oxides comprising tantalum oxynitride (TaON))) between the ferroelectric switching layer and the top and bottom electrodes, respectively. This may occur because the diffusion barrier material of the top and bottom electrodes has a low resistance to oxidation and is therefore susceptible to oxidation under the high temperatures of the baking process. Further, the migration of the oxygen atoms from the ferroelectric material may result in the formation of defects (e.g., oxygen vacancies) in the lattice of the ferroelectric material. These defects adversely affect the crystalline phase of the ferroelectric material, thereby mitigating an ability for the intrinsic electric dipole of the ferroelectric material to switch between the first and second polarization state. This decreases an ability to write data to the FeRAM device.

The present disclosure, in some embodiments, relates to a memory device (e.g., an FeRAM device) having multi-layer electrodes configured to mitigate formation of an oxide between a ferroelectric switching layer and the multi-layer electrodes. For example, the memory device comprises a ferroelectric switching layer disposed between a multi-layer top electrode and a multi-layer bottom electrode. The ferroelectric switching layer comprises a ferroelectric material. Further, the multi-layer top and bottom electrodes respectively comprise a first electrode layer and a second electrode layer, where the second electrode layer is disposed between the first electrode layer and the ferroelectric switching layer. For example, the multi-layer bottom electrode comprises a first bottom electrode layer underlying a second bottom electrode layer such that the second bottom electrode layer is disposed between the first bottom electrode layer and the ferroelectric switching layer. Furthermore, the first electrode layer (e.g., the first bottom electrode layer) has a first corrosion potential and the second electrode layer (e.g., the second bottom electrode layer) has a second corrosion potential that is higher than the first corrosion potential. Because the second corrosion potential is higher than the first corrosion potential, the second electrode layer is able to mitigate the formation of an oxide (e.g., an oxide of the first electrode layer, such as tantalum oxynitride (TaON)) between the multi-layer top or bottom electrodes and the ferroelectric switching layer. This may mitigate the formation of defects (e.g., oxygen vacancies) in the lattice of the ferroelectric material while the memory device is exposed to high temperatures (e.g., temperatures greater than or equal to 85 degrees Celsius), for example, during a baking process. By mitigating the formation of the defects in the lattice of the ferroelectric material, an intrinsic electric dipole of the ferroelectric material may be able to switch between a first polarization state and a second polarization state, thereby increasing a performance of the memory device.

Figure 1:
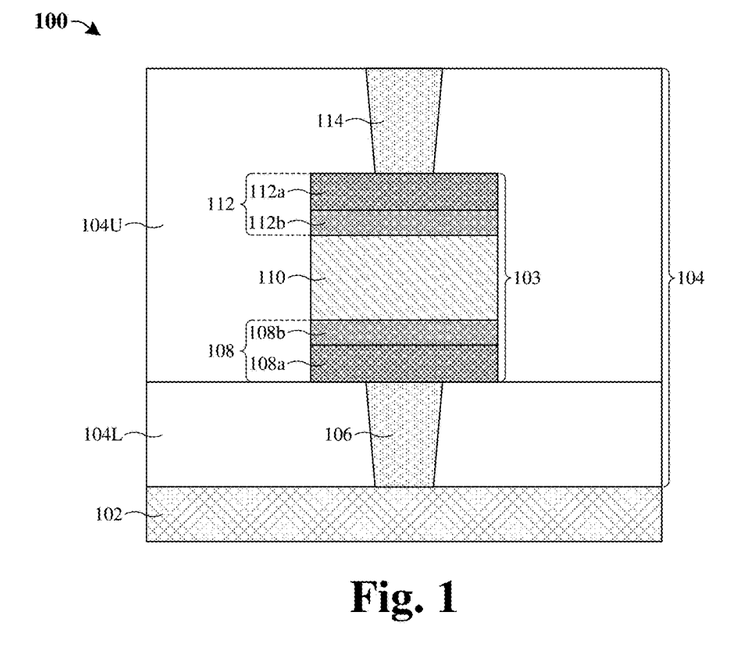
FIG. 1 illustrates a cross-sectional view of some embodiments of an integrated chip having a memory cell comprising a multi-layer top electrode and a multi-layer bottom electrode configured to mitigate oxide formation.

FIG. 1 illustrates a cross-sectional view of some embodiments of an integrated chip 100 having a memory cell 103 comprising a multi-layer bottom electrode 108 and a multi-layer top electrode 112 respectively configured to mitigate oxide formation.

The integrated chip 100 comprises the memory cell 103 disposed within a dielectric structure 104 over a substrate 102. The dielectric structure 104 comprises a plurality of stacked inter-level dielectric (ILD) layers. In some embodiments, the plurality of stacked ILD layers may comprise one or more lower ILD layers 104L arranged between the memory cell 103 and the substrate 102, and an upper ILD layer 104U surrounding the memory cell 103. In some embodiments, the one or more lower ILD layers 104L surround a lower interconnect 106 arranged below the memory cell 103. In further embodiments, the upper ILD layer 104U surrounds a top electrode via 114 that overlies the memory cell 103.

The memory cell 103 comprises the multi-layer bottom electrode 108, the multi-layer top electrode 112, and a ferroelectric switching layer 110 arrange between the multi-layer bottom and top electrodes 108, 112. The multi-layer bottom electrode 108 comprises a first bottom electrode layer 108a and a second bottom electrode layer 108b over the first bottom electrode layer 108a. The first bottom electrode layer 108a comprises a different material than the second bottom electrode layer 108b. The second bottom electrode layer 108b separates the first bottom electrode layer 108a from the ferroelectric switching layer 110. In some embodiments, the second bottom electrode layer 108b completely covers a top surface of the first bottom electrode layer 108a. The multi-layer top electrode 112 comprises a first top electrode layer 112a and a second top electrode layer 112b under the first top electrode layer 112a. The first top electrode layer 112a comprises a different material than the second top electrode layer 112b. The second top electrode layer 112b separates the first top electrode layer 112a from the ferroelectric switching layer 110. In some embodiments, the first top electrode layer 112a completely covers a top surface of the second top electrode layer 112b. In further embodiments, the first bottom electrode layer 108a and the first top electrode layer 112a respectively comprise a first conductive material (e.g., titanium nitride, tantalum nitride, etc.), and the second bottom electrode layer 108b and the second top electrode layer 112b respectively comprise a second conductive material (e.g., ruthenium, platinum, iridium, gold, palladium, osmium, molybdenum, tungsten, etc.). In yet further embodiments, the first conductive material is different from the second conductive material.

The second bottom electrode layer 108b and the second top electrode layer 112b are less susceptible to oxidation than the first bottom electrode layer 108a and the first top electrode layer 112a, respectively. Because the second bottom and top electrode layers 108b, 112b are less susceptible to oxidation than the first bottom and top electrode layers 108a, 112a, a migration of oxygen atoms from the ferroelectric switching layer 110 to the first bottom and top electrode layers 108a, 112a may be mitigated. This mitigates a formation of an oxide along an upper surface of the multi-layer bottom electrode 108 (e.g., between the multi-layer bottom electrode 108 and the ferroelectric switching layer 110) and along a lower surface of the multi-layer top electrode 112 (e.g., between the multi-layer top electrode 112 and the ferroelectric switching layer 110) during operation and/or fabrication of the memory cell 103. Further, by mitigating migration of oxygen atoms from the ferroelectric switching layer 110, the formation of defects (e.g., oxygen vacancies) within a lattice of the ferroelectric switching layer 110 may be reduced. This, in part, ensures that an intrinsic electric dipole of the ferroelectric switching layer 110 may more easily switching between a first polarization state and second polarization state, thereby increasing a switching speed and endurance of the memory cell 103.

Figure 2A:
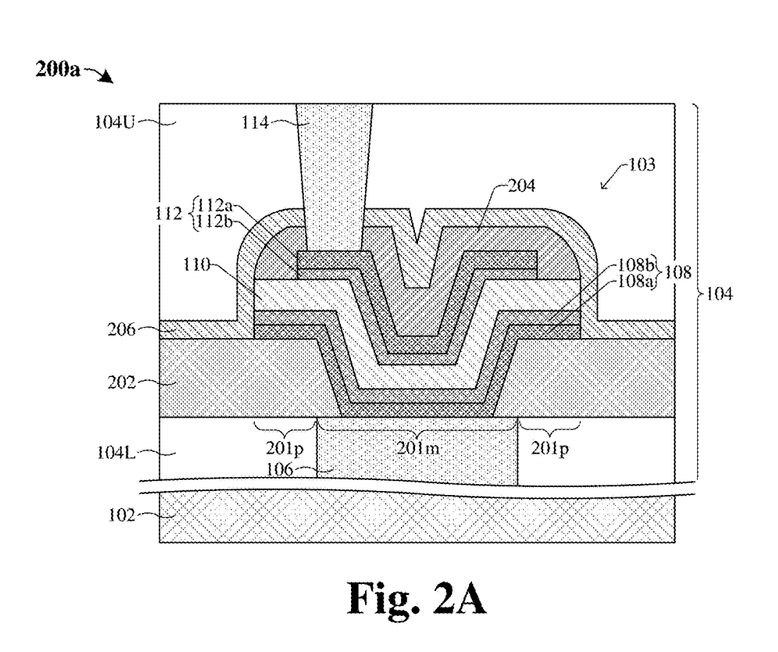
FIGS. 2A and 2B illustrate cross-sectional views of some additional embodiments of an integrated chip having a memory cell comprising a multi-layer top electrode and a multi-layer bottom electrode configured to mitigate oxide formation.

FIG. 2A illustrates a cross-sectional view of some additional embodiments of an integrated chip 200a having a memory cell 103 comprising a multi-layer bottom electrode 108 and a multi-layer top electrode 112 respectively configured to mitigate oxide formation.

The integrated chip 200a comprises a memory cell 103 disposed within a dielectric structure 104 arranged over a substrate 102. In some embodiments, the dielectric structure 104 comprises one or more lower ILD layers 104L and an upper ILD layer 104U. Further, a lower insulating structure 202 is disposed over the one or more lower ILD layers 104L. The lower insulating structure 202 comprises sidewalls that define an opening extending through the lower insulating structure 202. In various embodiments, the lower insulating structure 202 may, for example, be or comprise silicon nitride, silicon dioxide, silicon carbide, other suitable material(s), or any combination of the foregoing. In further embodiments, an upper insulating structure 206 is disposed over the memory cell 103 and the lower insulating structure 202. The upper insulating structure 206 continuously extends from a first position directly over the memory cell 103 to a second position abutting an upper surface of the lower insulating structure 202. The upper insulating structure 206 separates the memory cell 103 from the upper ILD layer 104U. In various embodiments, the upper insulating structure 206 may, for example, be or comprise silicon nitride, silicon carbide, silicon dioxide, other suitable material(s), or any combination of the foregoing.

In various embodiments, a lower interconnect 106 is disposed within the one or more lower ILD layers 104L. The lower interconnect 106 may, for example, be configured as a lower conductive via, a bottom electrode via, a lower conductive wire, or the like. In some embodiments, the lower interconnect 106 may, for example, be or comprise copper, aluminum, tungsten, titanium, tantalum, other suitable material(s), or any combination of the foregoing. Further, a top electrode via 114 overlies the memory cell 103. The top electrode via 114 may, for example, be configured as an upper conductive via, an upper conductive wire, or the like. In yet further embodiments, the top electrode via 114 may, for example, be or comprise copper, aluminum, tungsten, titanium, tantalum, other suitable material(s), or any combination of the foregoing.

The memory cell 103 is arranged between the sidewalls of the lower insulating structure 202 and over the lower insulating structure 202. In some embodiments, the memory cell 103 comprises a multi-layer bottom electrode 108 that is separated from a multi-layer top electrode 112 by way of a ferroelectric switching layer 110. The multi-layer bottom electrode 108 comprises a first bottom electrode layer 108a underlying a second bottom electrode layer 108b, and the multi-layer top electrode 112 comprises a first top electrode layer 112a and a second top electrode layer 112b. In various embodiments, the first bottom electrode layer 108a and the first top electrode layer 112a are respectively referred to as and/or configured as a diffusion barrier layer. For example, the first bottom electrode layer 108a may be configured as a bottom diffusion barrier layer that is configured to prevent diffusion of a diffusive species (e.g., copper) from the lower interconnect 106 to the ferroelectric switching layer 110. In yet another example, the first top electrode layer 112a may be configured as a top diffusion barrier layer that is configured to prevent diffusion of the diffusive species (e.g., copper) from the top electrode via 114 and/or other overlying interconnect layers (not shown) to the ferroelectric switching layer 110. This increases a switching performance of the memory cell 103.

In some embodiments, a hard mask layer 204 may be disposed on the multi-layer top electrode 112. In some embodiments, the hard mask layer 204 may be or comprise a dielectric material, such as silicon nitride, silicon carbide, silicon dioxide, another dielectric material, or any combination of the foregoing. In yet further embodiments, the hard mask layer 204 may extend continuously from an upper surface of the ferroelectric switching layer 110, along a sidewall of the multi-layer top electrode 112, to an upper surface of the multi-layer top electrode 112.

In some embodiments, the memory cell 103 comprises a middle region 201m over the lower interconnect 106, and a peripheral region 201p that is laterally offset from the lower interconnect 106. A bottom surface of the middle region 201m of the memory cell 103 is below a bottom surface of the peripheral region 201p of the memory cell 103. In various embodiments, layers within the memory cell 103 are respectively non-planar. This is because the layers are disposed within/over the opening defined by the sidewalls of the lower insulating structure 202. For example, the first bottom electrode layer 108a of the multi-layer bottom electrode 108 continuously extends from a top surface of the lower insulating structure 202, along sidewalls of the lower insulating structure 202 that define the opening, to a top surface of the lower interconnect 106. Further, layers within the memory cell 103 that overlie the first bottom electrode layer 108a conform to the shape of the first bottom electrode layer 108a. Thus, the first bottom electrode layer 108a, the second bottom electrode layer 108b, the ferroelectric switching layer 110, the first top electrode layer 112a, and the second top electrode layer 112b are respectively non-planar.

In some embodiments, the second bottom electrode layer 108b comprises a higher resistance to oxidation than the first bottom electrode layer 108a, and the second top electrode layer 112b comprises a higher resistance to oxidation than the first top electrode layer 112a. For example, in some embodiments, the first bottom and top electrode layers 108a, 112a respectively have a first corrosion potential and the second bottom and top electrode layers 108b, 112b respectively have a second corrosion potential that is greater than the first corrosion potential. In various embodiments, the first corrosion potential may be less than −0.75 volts (V), while the second corrosion potential may be greater than or equal to −0.75V. In other embodiments, the first corrosion potential may be about −0.75V, −1.37V, −1.63V, or some other suitable value, while the second corrosion potential may be about +0.75V, +1.52V, or some other suitable value. The greater corrosion potential of the second bottom and top electrode layers 108b, 112b causes the second bottom and top electrode layers 108b, 112b to be less susceptible to corrosion (e.g., oxidation) than the first bottom and top electrode layers 108a, 112a. This, in part, prevents the second bottom and top electrode layers 108b, 112b from reacting with the ferroelectric switching layer 110 when the memory cell 103 is exposed to high temperatures (e.g., temperatures greater than or equal to 85 degrees Celsius). Thus, the migration of oxygen atoms from the ferroelectric switching layer 110 to the multi-layer bottom and top electrodes 108, 112 may be mitigated, thereby reducing the formation of defects (e.g., oxygen vacancies) within a lattice of the ferroelectric switching layer 110.

In further embodiments, the first bottom and top electrode layers 108a, 112a respectively comprise a first material that utilizes a first Gibbs free energy to form an oxide and the second bottom and top electrode layers 108b, 112b respectively comprise a second material that utilizes a larger second Gibbs free energy to form an oxide. In some embodiments, the first bottom and top electrode layers 108a, 112a may respectively comprise a first material that utilizes a Gibbs free energy of less than approximately −760 kJ/mol to form an oxide, while the second bottom and top electrode layers 108b, 112b may respectively comprise a second material that utilizes a Gibbs free energy of greater than approximately −475 kJ/mol to form an oxide. In other embodiments, the first bottom and top electrode layers 108a, 112a may respectively comprise a first material that utilizes a Gibbs free energy of less than approximately −880 kJ/mol to form an oxide. In further embodiments, the second bottom and top electrode layers 108b, 112b may respectively comprise a second material that utilizes a Gibbs free energy of less than approximately −200 kJ/mol to form an oxide. In yet other embodiments, the second bottom and top electrode layers 108b, 112b may respectively comprise a second material that utilizes a Gibbs free energy of less than approximately −180 kJ/mol to form an oxide. In other embodiments, the second bottom and top electrode layers 108b, 112b may respectively comprise a second material that utilizes a Gibbs free energy of less than approximately 0 kJ/mol to form an oxide.

Because the second bottom and top electrode layers 108b, 112b are more resistant to oxidation than the first bottom and top electrode layers 108a, 112a, a non-ferroelectric dielectric material (e.g., tantalum oxynitride (TaON)) may not form between the first bottom and top electrode layers 108a, 112a and the ferroelectric switching layer 110. For example, during fabrication and/or operation of the memory cell 103, a baking process may be performed on the memory cell 103 to verify data retention of the memory cell 103 at high temperatures (e.g., about 85 degrees Celsius). By separating the first bottom and top electrode layers 108a, 112a from the ferroelectric switching layer 110 by the second bottom and top electrode layers 108b, 112b, respectively, an upper surface of the multi-layer bottom electrode 108 and a lower surface of the multi-layer top electrode 112 may not oxidize. This, in part, ensures that the intrinsic electric dipole of the ferroelectric switching layer 110 may switch between the first polarization state and the second polarization state, thereby increasing an endurance and performance of the memory cell 103.

In some embodiments, the first bottom and top electrode layers 108a, 112a may respectively have a thickness in a range of approximately 50 angstroms (Å) and approximately 500 Å, or another suitable thickness value. Having the first top electrode layer 112a with a thickness of greater than 50 Å allows the first top electrode layer 112a to prevent the top electrode via 114 from extending through the first top electrode layer 112a during fabrication. Further, having the first bottom electrode layer 108a with a thickness of greater than 50 Å allows the first bottom electrode layer 108a to mitigate or prevent diffusion of a diffusive species from the lower interconnect 106 to overlying layers (e.g., such as the ferroelectric switching layer 110). In various embodiments, the second bottom and top electrode layers 108b, 112b may respectively have a thickness in a range of approximately 10 Å and approximately 500 Å, or another suitable thickness value. In various embodiments, having the second bottom and top electrode layers 108b, 112b with a thickness of greater than 10 Å allows the second bottom and top electrode layers 108b, 112b to prevent diffusion of material from the first bottom and top electrode layers 108a, 112a to the ferroelectric switching layer 110. In further embodiments, having the second bottom and top electrode layers 108b, 112b with a thickness of less than 500 Å allows the second bottom and top electrode layers 108b, 112b to be formed within/over the opening defined by the sidewalls of the lower insulating structure 202 without voids. In further embodiments, the ferroelectric switching layer 110 may have a thickness in a range of approximately 40 Å and approximately 500 Å, or another suitable thickness value. In some embodiments, having the ferroelectric switching layer 110 with a thickness of greater than 40 Å allows the ferroelectric switching layer 110 to have a crystal phase (i.e., a crystal structure) that is configured to improve a ferroelectricity of the ferroelectric switching layer 110.

In some embodiments, the ferroelectric switching layer 110 may, for example, be or comprise hafnium oxide, hafnium zirconium oxide (HZO), lead zirconate titanate (PZT), or the like. In further embodiments, the ferroelectric switching layer 110 may be configured as and/or referred to as a data storage structure. In various embodiments, the first bottom and top electrode layers 108a, 112a may, for example, respectively be or comprise titanium nitride, tantalum nitride, some other suitable material(s), or any combination of the foregoing. In further embodiments, the second bottom and top electrode layers 108b, 112b may, for example, be or comprise ruthenium, platinum, iridium, gold, palladium, osmium, molybdenum, tungsten, some other suitable material(s), or any combination of the foregoing.

Figure 2B:
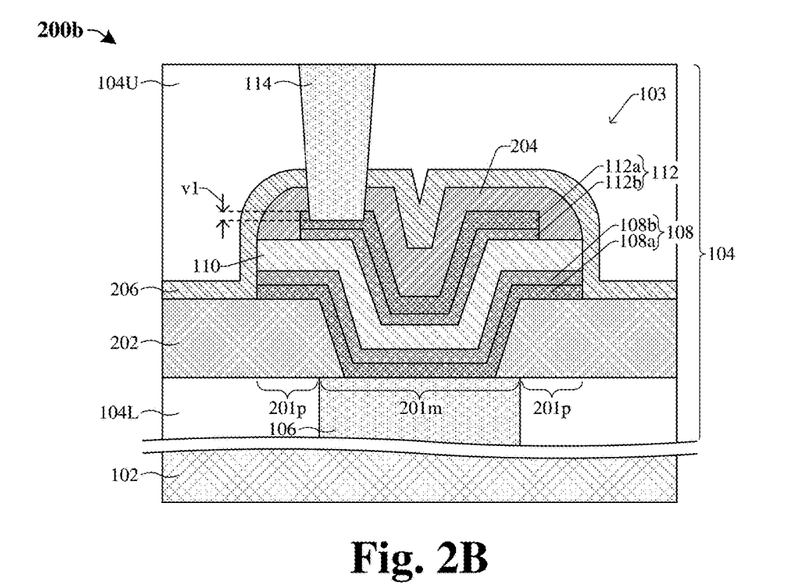

FIG. 2B illustrates a cross-sectional view of some embodiments of an integrated chip 200b corresponding to some alternative embodiments of the integrated chip 200a of FIG. 2A, where the top electrode via 114 extends continuously from a top surface of the first top electrode layer 112a to a point below the top surface of the first top electrode layer 112a by a vertical distance v1. In some embodiments, the vertical distance v1 is non-zero. In yet further embodiments, the point below the top surface of the first top electrode layer 112a is disposed above a top surface of the second top electrode layer 112b.

Figure 3:
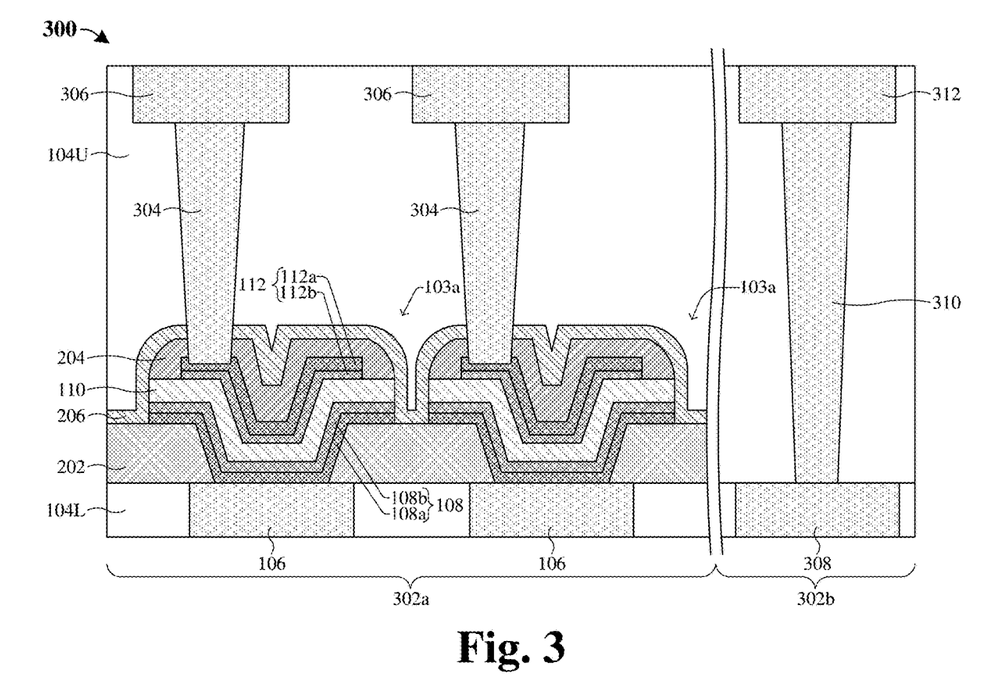
FIG. 3 illustrates a cross-sectional view of various embodiments of an integrated chip having an embedded memory region comprising a plurality of memory cells and a logic region laterally adjacent to the embedded memory region.

FIG. 3 illustrates a cross-sectional view of some embodiments of an integrated chip 300 having a first memory cell 103a and a second memory cell 103b laterally disposed within an embedded memory region 302a and a logic region 302b laterally adjacent to the embedded memory region 302a.

In some embodiments, the first and second memory cells 103a-b are respectively configured as the memory cell 103 of FIG. 2A. The first and second memory cells 103a-b are laterally offset from the logic region 302b. In various embodiments, a plurality of conductive vias 304 is disposed within the embedded memory region 302a and overlie the first and second memory cells 103a-b. Further, a plurality of conductive wires 306 is disposed within the embedded memory region 302a and overlie the plurality of conductive vias 304. The conductive vias and wires 304, 306 are configured to electrically couple the first and second memory cells 103a-b to other semiconductor devices (not shown) disposed within the integrated chip 300. In yet further embodiments, the logic region 302b comprises a lower conductive wire 308 disposed within the one or more lower ILD layers 104L. Further, a second conductive via 310 and a second conductive wire 312 are disposed within the logic region 302b and overlie the lower conductive wire 308.

Figure 4:
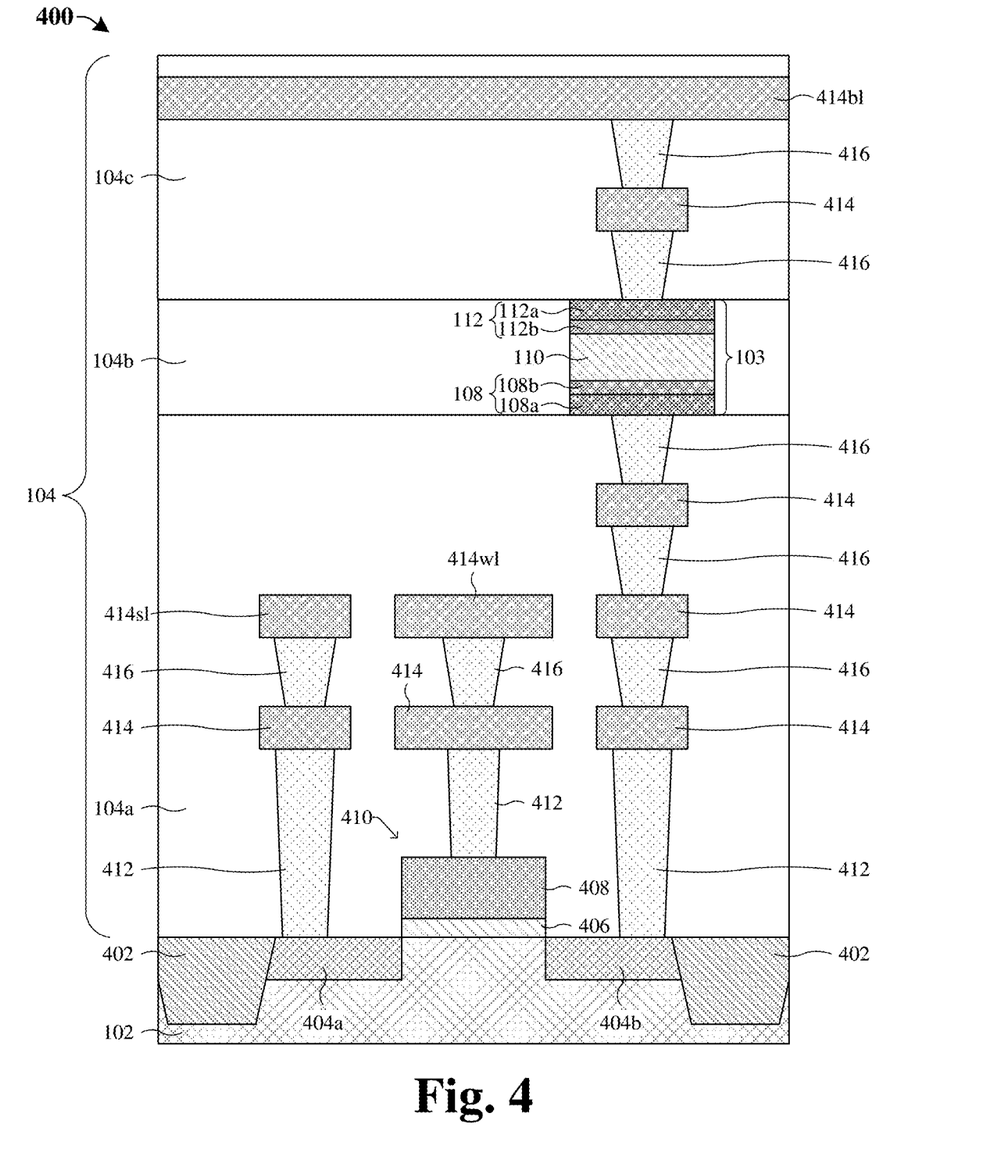
FIGS. 4 and 5 illustrate cross-sectional views of various embodiments of an integrated chip having a memory cell that comprises a multi-layer top electrode and a multi-layer bottom electrode configured to mitigate oxide formation.

FIG. 4 illustrates a cross-sectional view of some embodiments of an integrated chip 400 having a memory cell 103 disposed within a dielectric structure 104 arranged over a substrate 102. In some embodiments, the memory cell 103 of FIG. 4 is configured as the memory cell 103 of FIG. 1, 2A, or 2B. It will be appreciated that, in some embodiments, the integrated chip 400 may comprise a plurality of memory cells disposed in a memory array.

In some embodiments, the dielectric structure 104 comprises a plurality of stacked inter-level dielectric (ILD) layers 104a-c. The plurality of stacked ILD layers 104a-c comprise one or more lower ILD layers 104a that laterally surround one or more lower interconnect layers configured to couple the memory cell 103 to a semiconductor device 410 arranged within/over the substrate 102. In various embodiments, the semiconductor device 410 may be a metal-oxide semiconductor field-effect transistor (MOSFET), a bipolar junction transistor (BJT), a high-electric-mobility transistor (HEMT), or any other front-end-of-line semiconductor device. In further embodiments, the semiconductor device 410 may comprise a gate dielectric layer 406 overlying the substrate 102, a gate electrode 408 overlying the gate dielectric layer 406, and a pair of source/drain regions 404a-b disposed on opposing sides of the gate electrode 408. An isolation structure 402 is disposed within the substrate 102 and is configured to electrically isolate the semiconductor device 410 from other devices (not shown) disposed within and/or on the substrate 102.

An interconnect structure overlies the substrate 102 and the semiconductor device 410. In some embodiments, the interconnect structure comprises the dielectric structure 104, a plurality of conductive contacts 412, a plurality of conductive lines 414 (e.g., metal lines), and a plurality of conductive vias 416 (e.g., metal vias). The plurality of conductive contacts 412, the plurality of conductive lines 414, and the plurality of conductive vias 416 are electrically coupled in a predefined manner and configured to provide electrical connections between various devices disposed throughout the integrated chip 400. In further embodiments, the plurality of conductive contacts 412, the plurality of conductive lines 414, and/or the plurality of conductive vias 416 may, for example, respectively be or comprise titanium nitride, tantalum nitride, tungsten, ruthenium, aluminum, copper, some other suitable material(s), or any combination of the foregoing. In yet further embodiments, the plurality of ILD layers 104*a-c* may, for example, respectively be or comprise a low-k dielectric, an oxide (e.g., silicon dioxide), an extreme low-k dielectric, some other suitable material(s), or any combination of the foregoing. In further embodiments, the memory cell 103 is disposed in an upper ILD layer 104*b* that overlies a lower ILD layer 104*a*, such that the memory cell 103 is vertically above the plurality of conductive contacts 412 and/or vertically above one or more layers of the conductive lines 414 and the conductive vias 416. The memory cell 103 comprises the multi-layer bottom electrode 108, the ferroelectric switching layer 110, and the multi-layer top electrode 112.

A first one of the plurality of conductive lines 414 is denoted as 414*w*1 and may be referred to as a word line. In some embodiments, the word line 414*w*1 may be electrically coupled to the gate electrode 408 of the semiconductor device 410. A second one of the plurality of conductive lines 414 is denoted as 414*s*1 and may be referred to as a source line. In various embodiments, the source line 414*s*1 may be electrically coupled to a first source/drain region 404*a* of the semiconductor device 410. A third one of the plurality of conductive lines 414 is denoted as 414*b*1 and may be referred to as a bit line. In yet further embodiments, the bit line 414*b*1 may be electrically coupled to the multi-layer top electrode 112 of the memory cell 103 and the multi-layer bottom electrode 108 may be electrically coupled to a second source/drain region 404*b* of the semiconductor device 410.

In some embodiments, the memory cell 103 is electrically coupled to the second source/drain region 404*b* of the semiconductor device 410 via the interconnect structure. Thus, in some embodiments, application of a suitable word line voltage to the word line 414*w*1 may electrically couple the memory cell 103 between the bit line 414*b*1 and the source line 414*s*1. Consequently, by providing suitable bias conditions, the memory cell 103 may be switched between two data states.

Figure 5:
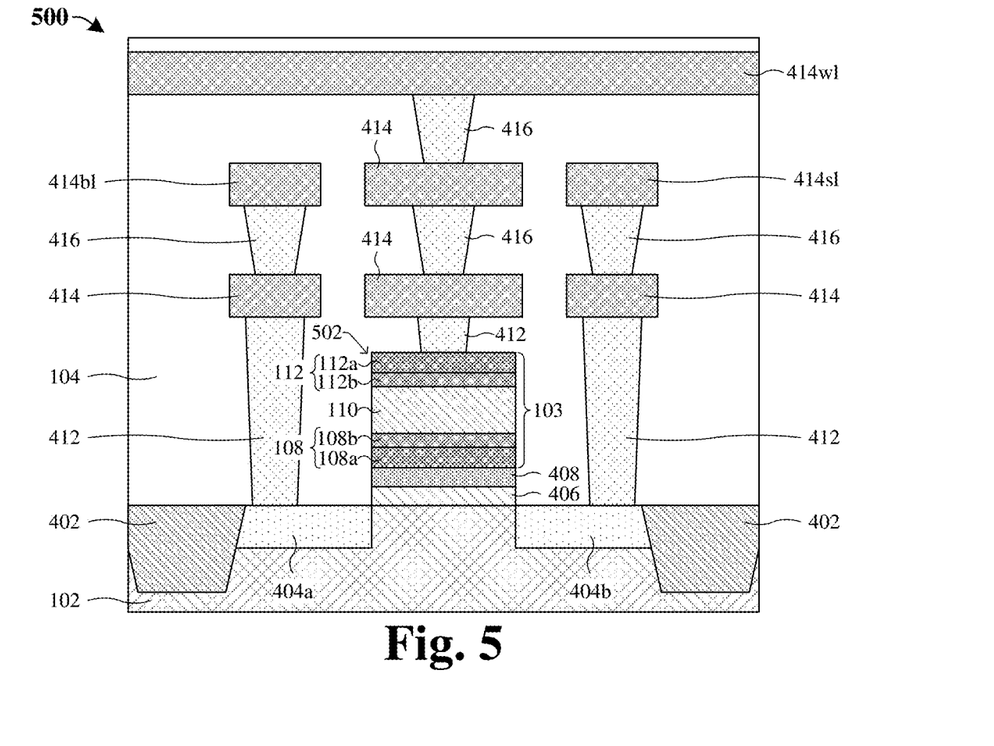

FIG. 5 illustrates a cross-sectional view of some embodiments of an integrated chip 500 having a device gate stack 502 overlying a substrate 102. In some embodiments, the device gate stack 502 comprises the memory cell 103, such that the memory cell 103 of FIG. 5 may be referred to as a front-end-of-line resistive memory cell.

The device gate stack 502 is disposed over the substrate 102 and is spaced laterally between the pair of source/drain regions 404*a-b*. In some embodiments, the device gate stack 502 includes a gate dielectric layer 406, a gate electrode 408, the multi-layer bottom electrode 108, the ferroelectric switching layer 110, and the multi-layer top electrode 112. Thus, in some embodiments, the device gate stack 502 may include the memory cell 103 directly overlying the gate electrode 408. In some embodiments, the word line 414*w*1 may be electrically coupled to the ferroelectric switching layer 110 via the interconnect structure. Thus, by providing suitable bias conditions to the word line 414*w*1, the bit line 414*b*1, and/or the source line 414*s*1, the ferroelectric switching layer 110 can be switched between two data states.

In some embodiments, the gate dielectric layer 406 may, for example, be or comprise a high-k dielectric material (e.g., such as hafnium oxide, zirconium oxide, etc.), silicon dioxide, some other suitable material(s), or any combination of the foregoing. In further embodiments, the gate electrode 408 may, for example, be or comprise aluminum, titanium nitride, tantalum nitride, a silicide, some other suitable conductive material(s), or any combination of the foregoing. The isolation structure 402 may be configured as a shallow trench isolation (STI) structure or another suitable isolation structure. In further embodiments, the isolation structure 402 may, for example, be or comprise silicon dioxide, silicon nitride, silicon carbide, some other suitable material(s), or any combination of the foregoing. In various embodiments, the substrate 102 comprises a first doping type (e.g., p-type) and the pair of source/drain regions 404*a-b* comprise a second doping type (e.g., n-type) that is opposite the first doping type.

FIGS. 6-13 illustrate cross-sectional views 600-1300 of some embodiments of a method for forming an integrated chip having a memory cell comprising a multi-layer top electrode and a multi-layer bottom electrode configured to mitigate oxide formation according to the present disclosure. Although the cross-sectional views 600-1300 shown in FIGS. 6-13 are described with reference to a method, it will be appreciated that the structures shown in FIGS. 6-13 are not limited to the method but rather may stand alone separate of the method. Although FIGS. 6-13 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
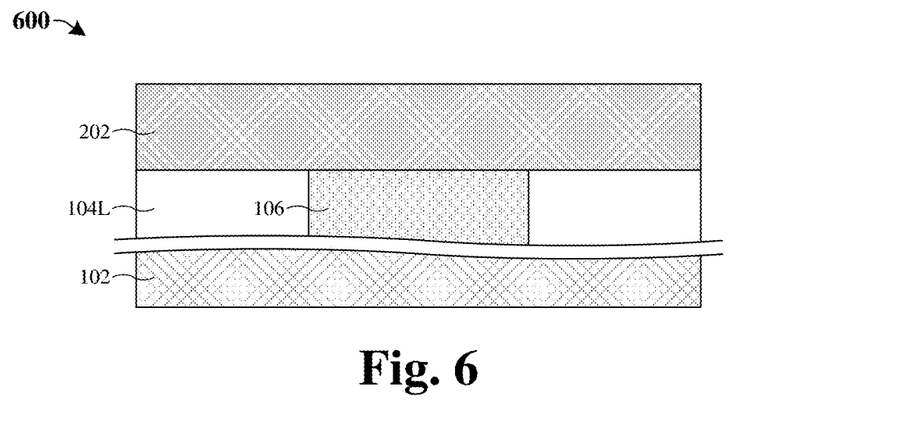
FIGS. 6-13 illustrate a series of cross-sectional views of some embodiments of a method for forming a memory cell comprising a multi-layer top electrode and a multi-layer bottom electrode.

As shown in cross-sectional view 600 of FIG. 6, a lower inter-level dielectric (ILD) layer 104L is formed over a substrate 102, and a lower interconnect 106 is formed within the lower ILD layer 104L. In some embodiments, the lower ILD layer 104L may, for example, be deposited by chemical vapor deposition (CVD), physical vapor deposition (PVD), atomic layer deposition (ALD), or another suitable deposition or growth process. In further embodiments, the lower interconnect 106 may be formed by a single damascene process, a dual damascene process, or another suitable formation process. Further, a lower insulating structure 202 is formed over the lower interconnect 106 and the lower ILD layer 104L. In various embodiments, the lower insulating structure 202 may, for example, be deposited by CVD, PVD, ALD, or another suitable deposition or growth process. In various embodiments, the substrate 102 may, for example, be or comprise a semiconductor body such as monocrystalline silicon/CMOS bulk, silicon-germanium (SiGe), a silicon-on-insulator (SOI), or another suitable semiconductor substrate material. In some embodiments, the lower interconnect 106 may be configured as a conductive wire or a conductive line.

Figure 7:
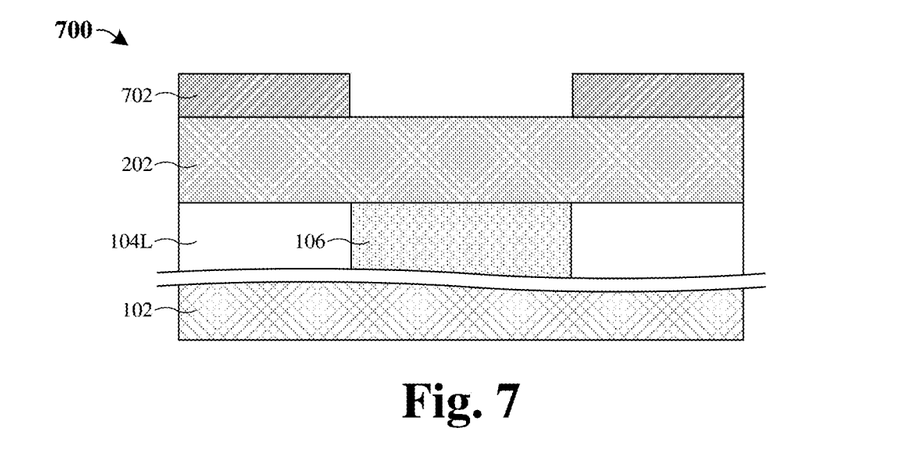

As shown in cross-sectional view 700 of FIG. 7, a masking layer 702 is formed over the lower insulating structure 202. In some embodiments, the masking layer 702 comprises a hard mask, a photoresist mask, a multi-layer hard mask, or the like. Further, the masking layer 702 comprises sidewalls that define an opening extending through the masking layer 702.

Figure 8:
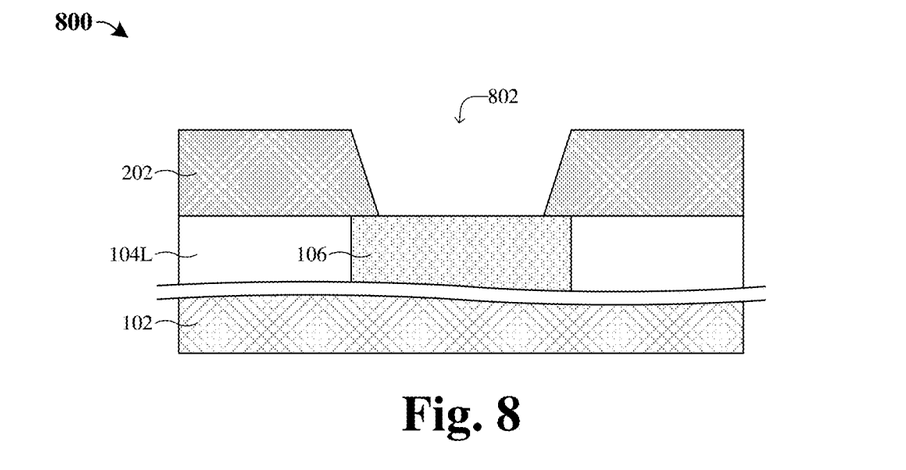

As shown in cross-sectional view 800 of FIG. 8, a patterning process is performed on the lower insulating structure 202 according to the masking layer (702 of FIG. 7) to form an opening 802 within the lower insulating structure 202. In various embodiments, the patterning process includes performing a dry etch, a wet etch, another suitable etch process, or any combination of the foregoing. Further, the patterning process exposes an upper surface of the lower interconnect 106. In yet further embodiments, after the patterning process a removal process is performed to remove the masking layer (702 of FIG. 7).

Figure 9:
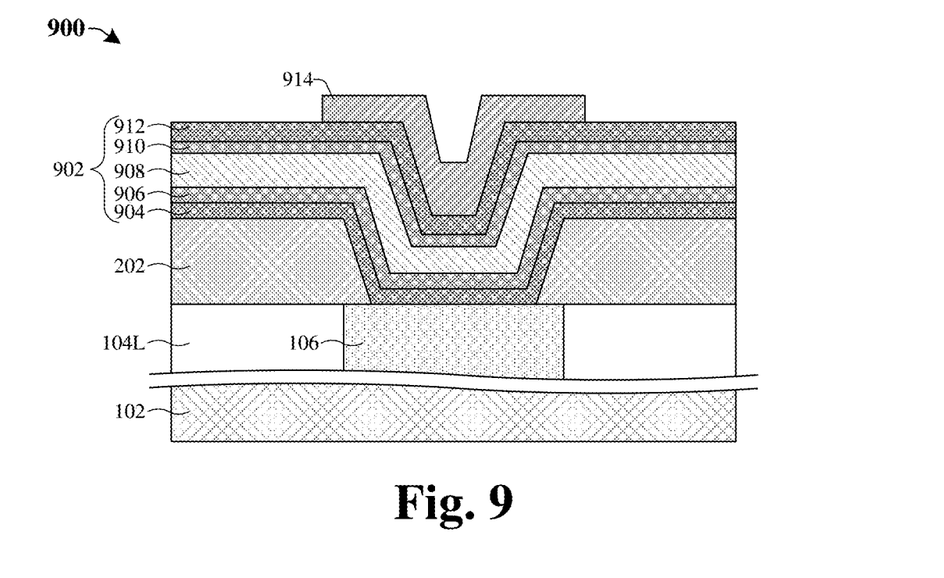

As shown in cross-sectional view 900 of FIG. 9, a memory device stack 902 is formed over the lower interconnect 106 and within the opening (802 of FIG. 8) such that layers within the memory device stack 902 conform to sidewalls of the lower insulating structure 202 that define the opening (802 of FIG. 8). Further, a masking layer 914 is formed over the memory device stack 902. In some embodiments, the memory device stack 902 comprises a first bottom electrode material 904, a second bottom electrode material 906 formed over the first bottom electrode material 904, a ferroelectric material 908 formed over the second bottom electrode material 906, a second top electrode material 910 formed over the ferroelectric material 908, and a first top electrode material 912 formed over the second top electrode material 910.

In some embodiments, the first bottom electrode material 904 may comprise a metal-nitride, such as titanium nitride, tantalum nitride, or the like and may be formed to a thickness in a range of approximately 50 angstroms (Å) and approximately 500 Å, or another suitable thickness value. In some embodiments, the second bottom electrode material 906 may comprise a metal such as ruthenium, platinum, iridium, gold, palladium, osmium, molybdenum, tungsten, or the like and may be formed to a thickness in a range of approximately 10 Å and approximately 500 Å, or another suitable thickness value. In some embodiments, the ferroelectric material 908 may comprise hafnium oxide, hafnium zirconium oxide (HZO), lead zirconate titanate (PZT), or the like and may be formed to a thickness in a range of approximately 40 Å and approximately 500 Å, or another suitable thickness value. In some embodiments, the first top electrode material 912 may comprise a metal-nitride, such as titanium nitride, tantalum nitride, or the like and may be formed to a thickness in a range of approximately 50 Å and approximately 500 Å, or another suitable thickness value. In some embodiments, the second top electrode material 910 may comprise a metal such as ruthenium, platinum, iridium, gold, palladium, osmium, molybdenum, tungsten, or the like and may be formed to a thickness in a range of approximately 10 Å and approximately 500 Å, or another suitable thickness value. In some embodiments, the first bottom electrode material 904 and the first top electrode material 912 may respectively comprise a first material (e.g., titanium nitride, tantalum nitride, etc.), and the second bottom electrode material 906 and the second top electrode material 910 may respectively comprise a second material (e.g., ruthenium, platinum, iridium, gold, palladium, osmium, molybdenum, tungsten, etc.) different than the first material. The second bottom electrode material 906 and the second top electrode material 910 respectively comprise a higher resistance to oxidation than the first bottom electrode material 904 and the first top electrode material 912. For example, in some embodiments, the first bottom electrode material 904 and the first top electrode material 912 respectively have a first corrosion potential and the second bottom electrode material 906 and the second top electrode material 910 respectively have a second corrosion potential that is greater than the first corrosion potential.

In various embodiments, the first bottom electrode material 904, the second bottom electrode material 906, the ferroelectric material 908, the first top electrode material 912, and the second top electrode material 910 may be formed by way of a plurality of different deposition processes (e.g., CVD, plasma enhance CVD (PE-CVD), sputtering, ALD, or the like). In some embodiments, the first bottom electrode material 904 and the second bottom electrode material 906 may be formed in-situ (e.g., without breaking a vacuum on a processing chamber). In some embodiments, the second top electrode material 910 and the first top electrode material 912 may be formed in-situ (e.g., without breaking a vacuum on a processing chamber).

Figure 10:
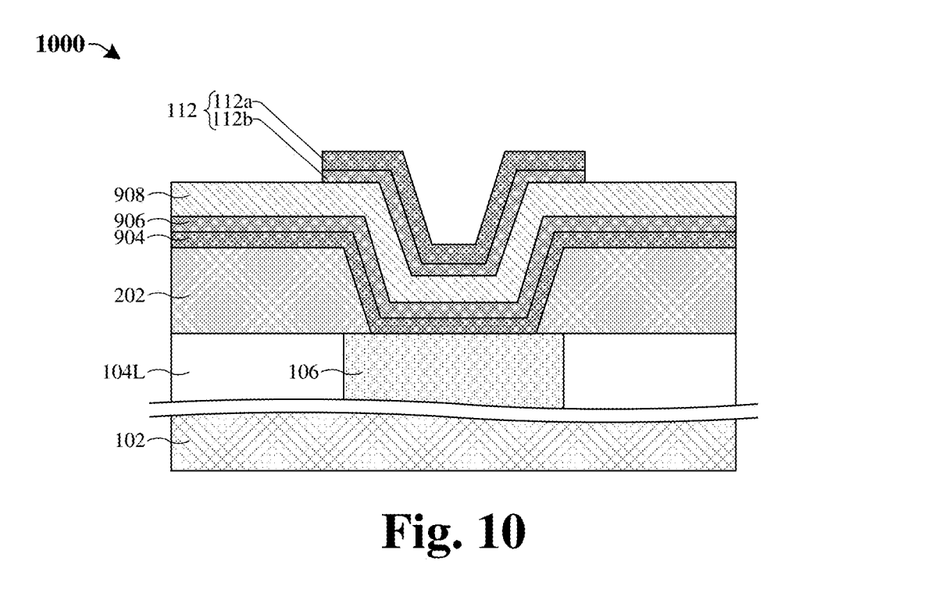

As shown in cross-sectional view 1000 of FIG. 10, a first etching process is performed to define a multi-layer top electrode 112 having a first top electrode layer 112a and a second top electrode layer 112b. In some embodiments, the first etching process selectively exposes the first top electrode material (912 of FIG. 9) and the second top electrode material (910 of FIG. 9) to a first etchant according to the masking layer (914 of FIG. 9). In various embodiments, the first etching process includes performing a plasma etch process or another suitable etching process. In yet further embodiments, after the first etching process, a removal process is performed to remove the masking layer (914 of FIG. 9).

Figure 11:
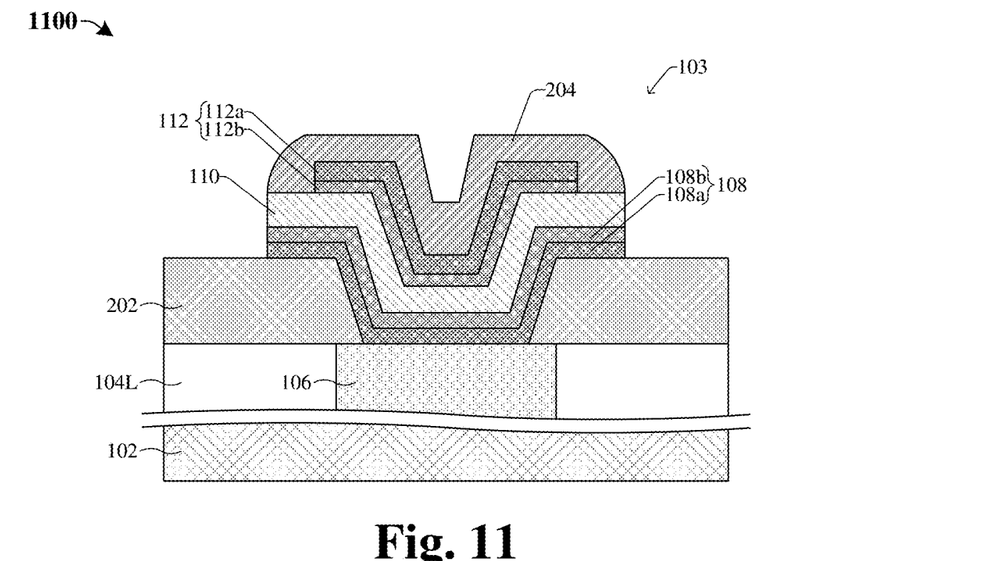

As shown in cross-sectional view 1100 of FIG. 11, a second etching process is performed to define a ferroelectric switching layer 110 and a multi-layer bottom electrode 108 having a first bottom electrode layer 108a and a second bottom electrode layer 108b. In yet further embodiments, the second etching process defines a memory cell 103 comprising the multi-layer bottom electrode 108, the ferroelectric switching layer 110, and the multi-layer top electrode 112. In some embodiments, the second etching process includes: forming a hard mask layer 204 over the ferroelectric material (908 of FIG. 10); and selectively exposing the ferroelectric material (908 of FIG. 10), the second bottom electrode material (906 of FIG. 10), and the first bottom electrode material (904 of FIG. 10) to a second etchant in areas that are not covered by the hard mask layer 204. In various embodiments, the hard mask layer 204 may be or comprise a dielectric material, such as silicon nitride, silicon carbide, silicon dioxide, another dielectric material, or any combination of the foregoing.

Figure 12:
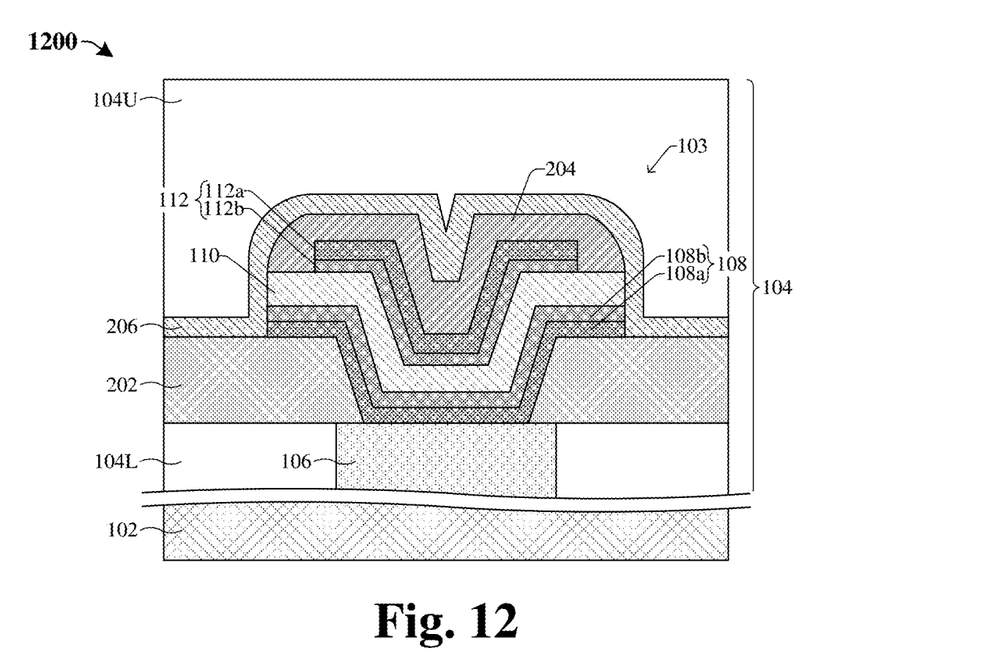

As shown in cross-sectional view 1200 of FIG. 12, an upper insulating structure 206 is formed over the memory cell 103. In some embodiments, the upper insulating structure 206 may be formed using one or more deposition techniques (e.g., PVD, CVD, PE-CVD, ALD, etc.). In various embodiments, the upper insulating structure 206 may comprise one or more of silicon carbide, tetraethyl orthosilicate (TEOS), some other material(s), or any combination of the foregoing. An upper ILD layer 104U is formed over the upper insulating structure 206 to define a dielectric structure 104 over the substrate 102. In some embodiments, the upper ILD layer 104U may be formed by a deposition process (e.g., PVD, CVD, PE-CVD, ALD, or the like). In various embodiments, the upper ILD layer 104U may comprise one or more of silicon dioxide, a low-k dielectric, an extreme low-k dielectric, some other material(s), or any combination of the foregoing.

Figure 13:
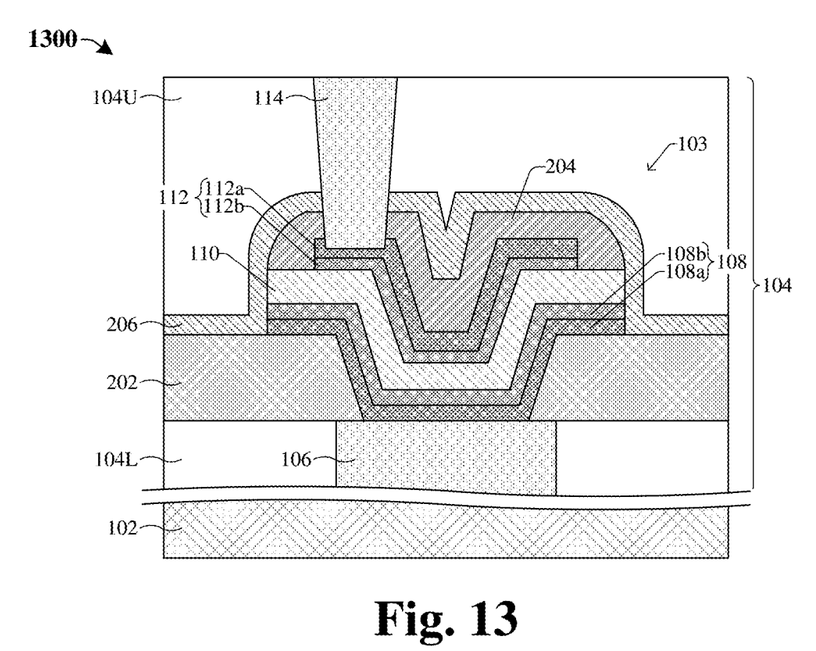

As shown in cross-sectional view 1300 of FIG. 13, a top electrode via 114 is formed over the memory cell 103. In various embodiments, a process for forming the top electrode via 114 includes: forming a masking layer (not shown) over the upper ILD layer 104U; patterning the upper ILD layer 104U, the upper insulating structure 206, and the hard mask layer 204 according to the masking layer to define a top electrode via opening over the multi-layer top electrode 112; forming a conductive material (e.g., by one or more deposition processes such as CVD, PVD, sputtering, etc.) within the top electrode via opening; and performing a planarization process into the conductive material to remove excess of the conductive material from over the upper ILD layer 104U.

In some embodiments, after forming the memory cell 103 and/or the top electrode via 114, a baking process is performed on the memory cell 103 to verify data retention of the memory cell 103 at high temperatures (e.g., temperatures greater than or equal to 85 degrees Celsius). In various embodiments, the baking process may reach a high temperature of approximately 85 degrees Celsius and/or may maintain the high temperature for a duration of approximately 10 hours. In some embodiments, if the second bottom and top electrode layers 108b, 112b are omitted (not shown), then the baking process may cause the first bottom and top electrode layers 108a, 112a to react with the ferroelectric switching layer 110 such that oxygen atoms migrate from the ferroelectric switching layer 110 to the first bottom and top electrode layers 108a, 112a. This, in part, may result in the formation of an oxide along an upper and lower surface of the ferroelectric switching layer 110 and/or may result in the formation of defects (e.g., oxygen vacancies) within the ferroelectric switching layer 110. The defects within the ferroelectric switching layer 110 may reduce a ferroelectricity of the ferroelectric switching layer 110, thereby mitigating an ability for the ferroelectric switching layer 110 to switch between a first polarization state and a second polarization state. However, according to embodiments of the present disclosure, the second bottom electrode layer 108b is disposed along the lower surface of the ferroelectric switching layer 110 and the second top electrode layer 112b is disposed along the upper surface of the ferroelectric switching layer 110. Because the second bottom and top electrode layers 108b, 112b respectively comprise a higher resistance to oxidation than the first bottom and top electrode layers 108a, 112a the second bottom and top electrode layers 108b, 112b may mitigate the migration of oxygen atoms from the ferroelectric switching layer 110 during the baking process. This, in part, increases a ferroelectricity of the ferroelectric switching layer 110 and increases a number of switching operations that may be performed on the memory cell 103.

Figure 14:
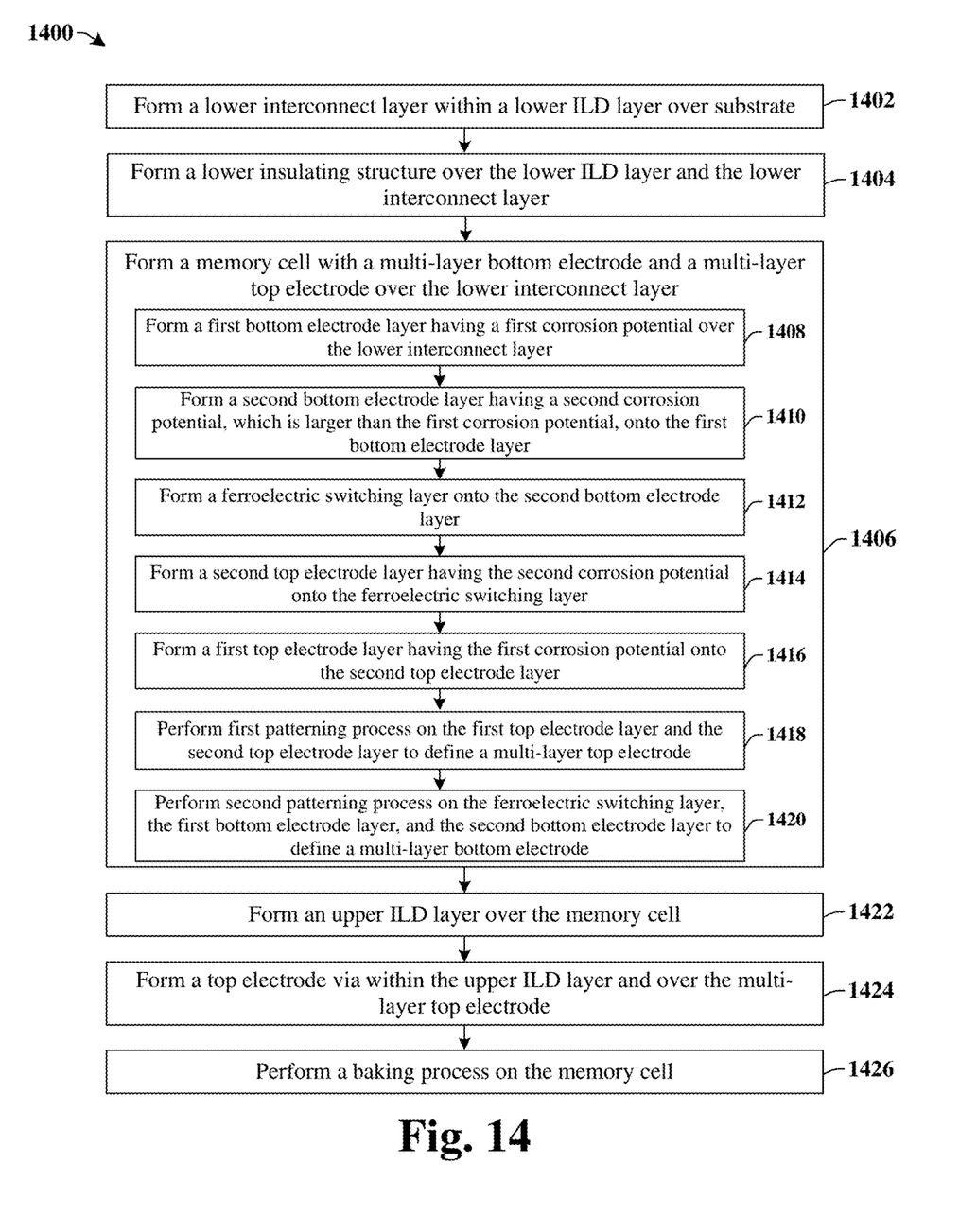
FIG. 14 illustrates a flowchart of some embodiments of a method for forming a memory cell comprising a multi-layer top electrode and a multi-layer bottom electrode.

FIG. 14 illustrates a flow diagram of some embodiments of a method 1400 of forming an integrated chip having a memory cell comprising a multi-layer top electrode and a multi-layer bottom electrode configured to mitigate oxide formation according to the present disclosure. Although the method 1400 is illustrated and/or described as a series of acts of events, it will be appreciated that the method 1400 is not limited to the illustrated ordering or acts. Thus, in some embodiments, the acts may be carried out in different orders than illustrated and/or may be carried out concurrently. Further, in some embodiments, the illustrated acts or events may be subdivided into multiple acts or events, which may be carried out at separate times or concurrently with other acts of sub-acts. In some embodiments, some illustrated acts or events may be omitted and other un-illustrated acts or events may be included.

At act 1402, a lower interconnect layer is formed within a lower inter-level dielectric (ILD) layer over a substrate. FIG. 6 illustrates a cross-sectional view 600 of some embodiments corresponding to act 1402.

At act 1404, a lower insulating structure is formed over the lower ILD layer and the lower interconnect layer. FIG. 6 illustrates a cross-sectional view 600 of some embodiments corresponding to act 1404.

At act 1406, a memory cell with a multi-layer bottom electrode and a multi-layer top electrode is formed over the lower interconnect layer. In some embodiments, the memory cell may be formed according to acts 1408-1420.

At act 1408, a first bottom electrode layer having a first corrosion potential is formed over the lower interconnect layer. FIG. 9 illustrates a cross-sectional view 900 of some embodiments corresponding to act 1408.

At act 1410, a second bottom electrode layer having a second corrosion potential, which is larger than the first corrosion potential, is formed onto the first bottom electrode layer. FIG. 9 illustrates a cross-sectional view 900 of some embodiments corresponding to act 1410.

At act 1412, a ferroelectric switching layer is formed onto the second bottom electrode layer. FIG. 9 illustrates a cross-sectional view 900 of some embodiments corresponding to act 1412.

At act 1414, a second top electrode layer having the second corrosion potential is formed onto the ferroelectric switching layer. FIG. 9 illustrates a cross-sectional view 900 of some embodiments corresponding to act 1414.

At act 1416, a first top electrode layer having the first corrosion potential is formed onto the second top electrode layer. FIG. 9 illustrates a cross-sectional view 900 of some embodiments corresponding to act 1416.

At act 1418, a first patterning process is performed on the first top electrode layer and the second top electrode layer to define a multi-layer top electrode. FIG. 10 illustrates a cross-sectional view 1000 of some embodiments corresponding to act 1418.

At act 1420, a second patterning process is performed on the ferroelectric switching layer, the first bottom electrode layer, and the second bottom electrode layer to define a multi-layer bottom electrode. FIG. 11 illustrates a cross-sectional view 1100 of some embodiments corresponding to act 1420.

At act 1422, an upper ILD layer is formed over the memory cell. FIG. 12 illustrates a cross-sectional view 1200 of some embodiments corresponding to act 1422.

At act 1424, a top electrode via is formed within the upper ILD layer and over the multi-layer top electrode. FIG. 13 illustrates a cross-sectional view 1300 of some embodiments corresponding to act 1424.

At act 1426, a baking process is performed on the memory cell. FIG. 13 illustrates a cross-sectional view 1300 of some embodiments corresponding to act 1426.

Accordingly, in some embodiments, the present disclosure relates to a memory device (e.g., a ferroelectric memory device) that comprises a ferroelectric switching layer disposed between a multi-layer bottom electrode and a multi-layer top electrode. The multi-layer bottom electrode and the multi-layer top electrode are configured to mitigate formation of an oxide along an upper surface and a lower surface of the ferroelectric switching layer.

In some embodiments, the present application provides a memory device, including: a first bottom electrode layer overlying a substrate; a ferroelectric switching layer disposed over the first bottom electrode layer; a first top electrode layer disposed over the ferroelectric switching layer; and a second bottom electrode layer disposed between the first bottom electrode layer and the ferroelectric switching layer, wherein the second bottom electrode layer is less susceptible to oxidation than the first bottom electrode layer.

In further embodiments, the present application provides an integrated chip, including: a lower interconnect within a lower inter-level dielectric (ILD) layer over a substrate; a memory cell disposed over the lower interconnect, wherein the memory cell comprises a ferroelectric switching layer disposed between a multi-layer bottom electrode and a multi-layer top electrode; and wherein the multi-layer bottom electrode comprises a first bottom electrode layer and a second bottom electrode layer disposed between the first bottom electrode layer and the ferroelectric switching layer, wherein the multi-layer top electrode comprises a first top electrode layer and a second top electrode layer disposed between the first top electrode layer and the ferroelectric switching layer, wherein the first bottom electrode layer and the first top electrode layer comprise a first material and the second bottom electrode layer and the second top electrode layer comprise a second material different than the first material.

In yet further embodiments, the present application provides a method for forming a memory device, the method includes: forming a first bottom electrode layer over a substrate and a second bottom electrode layer over the first bottom electrode layer, wherein the second bottom electrode layer has a greater corrosion potential than the first bottom electrode layer; forming a ferroelectric switching layer over the second bottom electrode layer; forming a second top electrode layer over the ferroelectric switching layer and a first top electrode layer over the second top electrode layer, wherein the second top electrode layer has a greater corrosion potential than the first top electrode layer; performing a first patterning process on the first top electrode layer and the second top electrode layer to define a multi-layer top electrode; and performing a second patterning process on the first bottom electrode layer and the second bottom electrode layer to define a multi-layer bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, comprising:
   forming a non-oxidized first bottom electrode layer over a substrate and a second bottom electrode layer over the non-oxidized first bottom electrode layer, wherein the second bottom electrode layer has a greater corrosion potential than the non-oxidized first bottom electrode layer, wherein the non-oxidized first bottom electrode layer directly contacts the second bottom electrode layer;
   forming a ferroelectric switching layer over the second bottom electrode layer, wherein the second bottom electrode layer directly contacts the ferroelectric switching layer;
   forming a second top electrode layer over the ferroelectric switching layer and a first top electrode layer over the second top electrode layer, wherein the second top electrode layer has a greater corrosion potential than the first top electrode layer;
   performing a first patterning process on the first top electrode layer and the second top electrode layer to define a multi-layer top electrode; and
   performing a second patterning process on the non-oxidized first bottom electrode layer and the second bottom electrode layer to define a multi-layer bottom electrode.

2. The method of claim 1, further comprising:
   forming a lower inter-level dielectric (ILD) layer over the substrate;
   forming a lower interconnect within the ILD layer;
   forming a lower insulating structure over the lower ILD layer and the lower interconnect;
   patterning the lower insulating structure to form an opening over the lower interconnect; and
   wherein the non-oxidized first bottom electrode layer is formed over the lower insulating structure and the lower interconnect such that the non-oxidized first bottom electrode layer extends from an upper surface of the lower insulating structure, along sidewalls of the lower insulating structure defining the opening, to an upper surface of the lower interconnect.

3. The method of claim 2, wherein a bottom surface of the first top electrode layer is disposed below the upper surface of the lower insulating structure.

4. The method of claim 1, further comprising:
   forming a hard mask layer over the multi-layer top electrode and the ferroelectric switching layer such that the hard mask layer comprises a protrusion extending below an upper surface of the ferroelectric switching layer.

5. The method of claim 4, further comprising:
   forming an upper insulating structure over the hard mask layer, wherein the upper insulating structure continuously extends from opposing outer sidewalls of the multi-layer bottom electrode to an upper surface of the hard mask layer.

6. The method of claim 1, wherein outer sidewalls of the first top electrode layer and outer sidewalls of the second top electrode layer are aligned.

7. The method of claim 6, wherein outer sidewalls of the multi-layer bottom electrode are aligned with outer sidewalls of the ferroelectric switching layer, and wherein the outer sidewalls of the second top electrode layer are spaced laterally between the outer sidewalls of the multi-layer bottom electrode.

8. The method of claim 1, further comprising:
   performing a baking process, wherein the second bottom electrode layer and the second top electrode layer are configured to prevent a migration of oxygen atoms from the ferroelectric switching layer during the baking process.

9. The method of claim 8, wherein the baking process is performed at a temperature greater than or equal to 85 degrees Celsius.

10. The method of claim 9, wherein the baking process maintains the temperature for a duration of at least 10 hours.

11. A method for forming a memory device, comprising:
    forming a multi-layer bottom electrode over a substrate, wherein the multi-layer bottom electrode comprises a first bottom electrode layer and a second bottom electrode layer over the first bottom electrode layer;
    forming a ferroelectric switching layer on the multi-layer bottom electrode;
    forming a multi-layer top electrode on the ferroelectric switching layer, wherein the multi-layer top electrode comprises a first top electrode layer and a second top electrode layer disposed between the first top electrode layer and the ferroelectric switching layer, wherein the first bottom electrode layer and the first top electrode layer comprise a first conductive material, and wherein the second bottom electrode layer and the second top electrode layer comprise a second conductive material different from the first conductive material; and performing a baking process, wherein the second top electrode layer is configured to prevent oxidation of the first top electrode layer during the baking process.

12. The method of claim 11, wherein the first conductive material comprises titanium nitride or tantalum nitride, and the second conductive material comprises ruthenium, platinum, iridium, gold, palladium, osmium, molybdenum, or tungsten.

13. The method of claim 11, wherein a thickness of the ferroelectric switching layer is greater than a thickness of the second bottom electrode layer and a thickness of the second top electrode layer.

14. The method of claim 11, further comprising:
forming a lower interconnect below the multi-layer bottom electrode, wherein the first bottom electrode layer is configured to prevent diffusion of a first diffusive species from the lower interconnect to the ferroelectric switching layer.

15. The method of claim 14, further comprising:
forming a top electrode via on the multi-layer top electrode, wherein the first top electrode layer is configured to prevent diffusion of a second diffusive species from the top electrode via to the ferroelectric switching layer.

16. The method of claim 11, wherein the first conductive material utilizes a first Gibbs free energy to form an oxide and the second conductive material utilizes a second Gibbs free energy to form an oxide that is greater than the first Gibbs free energy.

17. A method for forming a memory device, comprising:
depositing a lower insulating structure over a lower interconnect;
patterning the lower insulating structure to form an opening over the lower interconnect;
forming a multi-layer bottom electrode over the lower insulating structure and lining the opening, wherein the multi-layer bottom electrode comprises a middle region contacting the lower interconnect and a peripheral region disposed on a top surface of the lower insulating structure;
depositing a ferroelectric layer on the multi-layer bottom electrode; and
forming a multi-layer top electrode over the ferroelectric layer, wherein the multi-layer top electrode comprises a first top electrode layer and a second top electrode layer disposed between the first top electrode layer and the ferroelectric layer, wherein the second top electrode layer has a greater Gibbs free energy to form oxide than the first top electrode layer, wherein the second top electrode layer directly contacts the first top electrode layer and the ferroelectric layer.

18. The method of claim 17, wherein a bottom surface of the multi-layer top electrode is disposed below the top surface of the lower insulating structure.

19. The method of claim 17, further comprising:
performing a baking process, wherein the second top electrode layer is configured to prevent oxidation of the first top electrode layer during the baking process.

20. The method of claim 17, further comprising:
depositing an upper insulating structure over the multi-layer top electrode and the ferroelectric layer, wherein the upper insulating structure comprises a protrusion extending below a top surface of the multi-layer top electrode.

* * * * *